(12) United States Patent
Joo et al.

(10) Patent No.: US 7,675,061 B2
(45) Date of Patent: Mar. 9, 2010

(54) DISPLAY DEVICE AND DRIVING METHOD THEREOF

(75) Inventors: In-Su Joo, Seongnam-si (KR);
Chun-Seok Ko, Hwaseong-si (KR);
Kwang-Chul Jung, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1126 days.

(21) Appl. No.: 11/262,176

(22) Filed: Oct. 27, 2005

(65) Prior Publication Data

US 2006/0227081 A1 Oct. 12, 2006

(30) Foreign Application Priority Data

Apr. 7, 2005 (KR) .................... 10-2005-0028916

(51) Int. Cl.
*H01J 63/04* (2006.01)
*G09G 3/20* (2006.01)

(52) U.S. Cl. ................... 257/59; 257/72; 257/E27.131; 313/500; 313/505; 345/55

(58) Field of Classification Search ............... 257/72, 257/59, E27.131; 345/55; 313/500, 505
See application file for complete search history.

(56) References Cited

U.S. PATENT DOCUMENTS

| | | | | |
|---|---|---|---|---|
| 6,753,655 | B2 * | 6/2004 | Shih et al. | 315/169.3 |
| 2001/0015715 | A1 * | 8/2001 | Hebiguchi et al. | 345/92 |
| 2002/0070905 | A1 * | 6/2002 | Kodate et al. | 345/55 |
| 2005/0030268 | A1 * | 2/2005 | Zhang et al. | 345/83 |

FOREIGN PATENT DOCUMENTS

| | | |
|---|---|---|
| CN | 1276590 | 12/2000 |
| CN | 1435805 | 8/2003 |

* cited by examiner

*Primary Examiner*—Minh-Loan T Tran
(74) *Attorney, Agent, or Firm*—Innovation Counsel LLP

(57) ABSTRACT

A display device includes a first pixel and a second pixel. The first pixel and the second pixel are defined by a first gate bus line, a second gate bus line, a first power supply line and a second power supply line. A data bus line between the first supply line and the second supply line divides the first pixel from the second pixel line. Accordingly, the pixel shares a data bus line or a power supply line with adjacent pixel. Advantageously, thereby, more space between lines prevents defects caused during fabricating the display device and improve a reliability of the display device.

13 Claims, 9 Drawing Sheets

DISPLAY DEVICE AND DRIVING METHOD THEREOF

CROSS-REFERENCE TO RELATED APPLICATION

This application claims priority from Korean Patent Application No. 2005-028916 filed on Apr. 7, 2005, the disclosure of which is hereby incorporated herein by reference in its entirety for all purposes.

BACKGROUND

1. Field of the Invention

The present invention relates generally to a display device, a driving method thereof, and in particular to an organic light emitting display (OLED) device and a driving method thereof.

2. Description of Related Art

Consumers, in general, want electronic devices with displays, such as mobile communication systems, digital cameras, notebook PCs, monitors, and televisions, to be light and thin. One method of achieving this is to use flat panel displays, such as ones having an organic light emitting display (OLED).

Generally, an active matrix flat panel display includes a plurality of pixels arranged in a matrix and displays images by controlling the luminance of the pixels based on given luminance information.

Conventionally, a pixel of an OLED includes a gate bus line, a data bus line, and a power supply line providing a driving voltage Vdd. A pixel of OLED further includes a switching transistor connected to the gate bus line and the data bus line, a driving transistor connected to the power supply line, a storage capacitor, and a light emitting element connected to the driving transistor.

A distance between data bus line of a pixel and power supply line of neighboring pixel is about 5 μm to increase emissive area. This distance often results in a short circuit between data bus line and power supply line during fabricating the display device. The short circuit causes a driving voltage Vdd to be applied to data bus line, and display device makes an image error. Thus, there is a need for display panel having simple pixel design and more space between lines.

SUMMARY OF THE INVENTION

The present invention provides a display panel capable of reducing defects generated during a manufacturing process thereof.

The present invention also provides a display device having the above display panel.

The present invention also provides a method of driving the above display device.

In an exemplary display panel according to the present invention, the display panel includes a first pixel portion and a second pixel portion. The first pixel portion is formed in a region defined by first and second gate bus lines that are adjacent to each other and extended along a first direction, a first bias voltage line extended along a second direction that is substantially perpendicular to the first direction, and a data line that is extended along the second direction. The second pixel portion is formed in a region defined by the first and second gate bus lines, a second bias voltage line extended along the second direction and the data line, so that the first and second pixel portions share the data line.

In another exemplary display panel according to the present invention, the display panel includes a gate bus line set, a bias voltage line set, a data line, a first switching device, a first control device, a first driving device, a second switching device, a second control device and a second driving device. The gate bus line set includes a first gate bus line and a second gate bus line adjacent to each other. The bias voltage line set includes a first bias voltage line and a second bias voltage line adjacent to each other. The data line is disposed between the first and second bias voltage lines. The first switching device includes a first electrode that is electrically connected to the data line, a second electrode that is electrically connected to the first gate bus line, and a third electrode. The first control device includes a first electrode that is electrically connected to the third electrode of the first switching device, a second electrode that is electrically connected to the second gate bus line, and a third electrode that is electrically connected to a first node. The first driving device includes a first electrode that is electrically connected to the first bias voltage line, a second electrode that is electrically connected to the first node, and a third electrode that is electrically connected to a first light emitting device. The second switching device includes a first electrode that is electrically connected to the data line, a second electrode that is electrically connected to the first gate bus line, and a third electrode. The second control device includes a first electrode that is electrically connected to the third electrode of the second switching device, a second electrode that is electrically connected to the first gate bus line, and a third electrode that is electrically connected to a second node. The second driving device includes a first electrode that is electrically connected to the second bias voltage line, a second electrode that is electrically connected to the second node, and a third electrode that is electrically connected to a second light emitting device.

In an exemplary display device according to the present invention, the display device includes a display panel, a gate driving section and a data driving section. The display panel includes a first light emitting device that is electrically coupled with a first gate bus line, a second gate bus line that is adjacent to the first gate bus line and a data line, and a second light emitting device that is electrically connected to be coupled with the first gate bus line and the data line. The gate driving section outputs a first gate signal that is applied to the first gate bus line to activate the first gate bus line, and a second gate signal that is applied to the second gate bus line to activate the second gate bus line. The gate driving section outputs the first gate signal including a first sub pulse having a first time interval and a first main pulse having a second time interval that is longer than the first time interval, and a second gate signal including a second sub pulse having the first time interval and a second main pulse having the second time interval in sequence such that the second sub pulse overlaps with the first main pulse. The data driving section applies a first data signal for the first light emitting device to the data line during the first time interval when the second sub pulse overlaps with the first main pulse, and a second data signal for the second light emitting device to the data line during a remaining second time interval except for the first time interval.

In an exemplary method of driving a display device including a first light emitting device that is electrically coupled with a first gate bus line, a second gate bus line that is adjacent to the first gate bus line and a data line, and a second light emitting device that is electrically connected to be coupled with the first gate bus line and the data line, comprising, a first data signal is applied to the data line in order to drive the first light emitting device, when the first and second gate bus lines are activated. Then, a second data signal is applied to the data line in order to drive the second light emitting device, when the first gate bus line is activated and the second gate bus line is inactivated.

Therefore, two pixel portions adjacent to each other may share one of the data line and the bias voltage line. As a result, an interval between the data line and the bias voltage line increases to prevent electrical short between the data line and the bias voltage line, which may occur during a process of manufacturing a display panel.

BRIEF DESCRIPTION OF THE DRAWINGS

The features of the present invention will become more apparent to those of ordinary skill in the art in light of the below described exemplary embodiments thereof with reference to the attached drawings, in which.

DETAILED DESCRIPTION OF PREFERRED EMBODIMENTS

Figure 1:
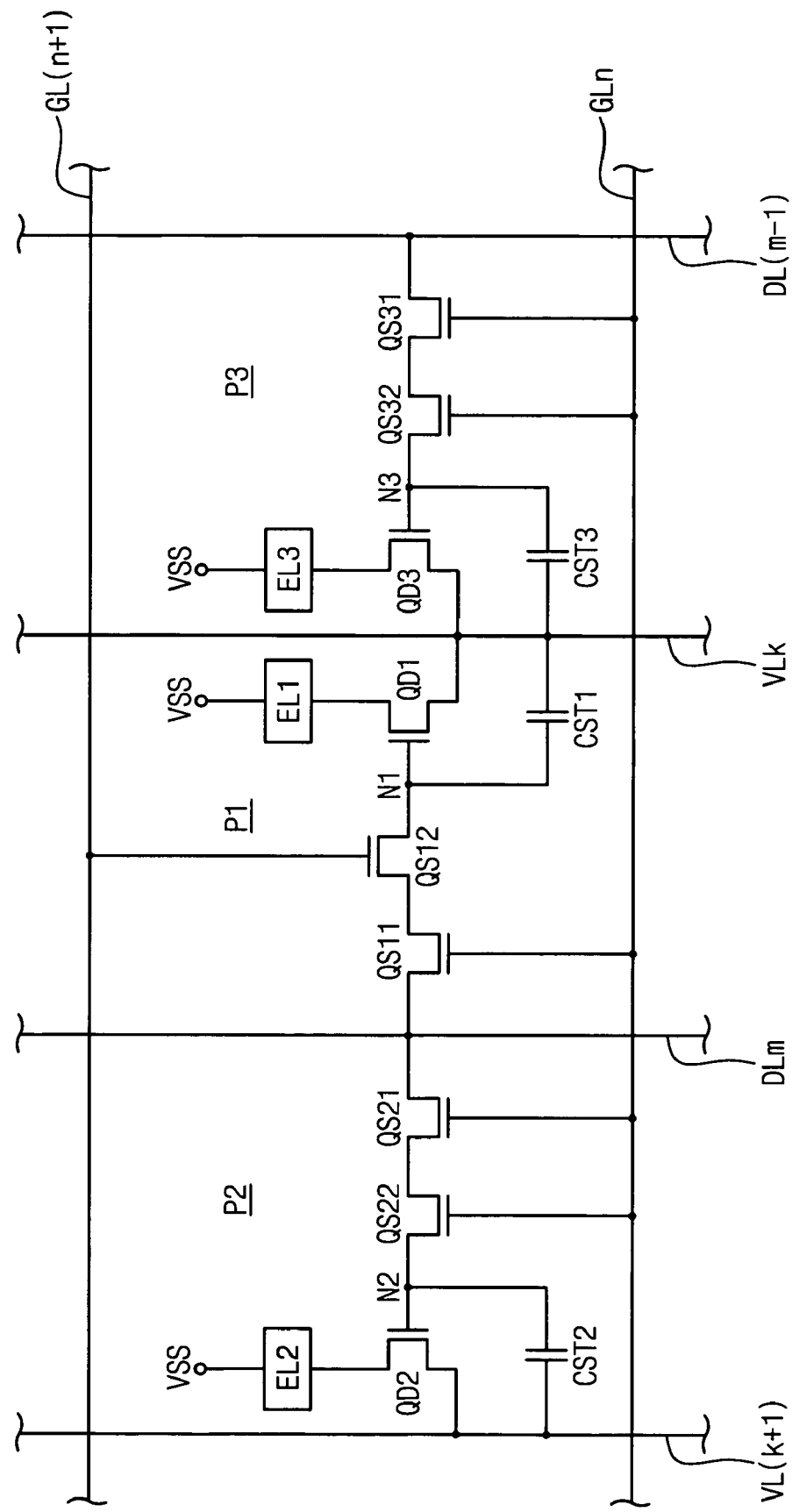
FIG. 1 is an equivalent circuit diagram of pixels of an OLED according to an embodiment of the present invention.

FIG. 1 is an equivalent circuit diagram of pixels of an OLED according to an embodiment of the present invention.

Referring to FIG. 1, there is a first pixel P1 between a second pixel P2 and a third pixel P3. First pixel P1 shares a $m_{th}$ data bus line DLm with second pixel P2 and a kth power supply line VLk with third pixel P3.

First pixel P1 is bounded by an nth gate bus line GLn, kth power supply line VLk and mth data bus line DLm. First pixel P1 includes a first switching transistor QS11, a second switching transistor QS12, a driving transistor QD1, a storage capacitor CST1 and a light emitting element EL1.

First switching transistor QS11 has a source electrode connected to mth data bus line DLm, a drain electrode connected to second switching transistor QS12, and a gate electrode connected to nth gate bus line GLn.

Second switching transistor QS12 has a source electrode connected to first switching transistor QS11, a drain electrode connected to driving transistor QD1, and a gate electrode connected to (n+1)th gate bus line GLn+1.

Driving transistor QD1 has a drain electrode connected to kth power supply line VLk, a source electrode connected to light emitting element EL1, and a gate electrode connected to the drain electrode of second switching transistor QS12.

Storage capacitor CST1 has one terminal connected to node N1 which is intermediate the drain electrode of second switching transistor QS12 and the gate electrode of driving transistor QD1, and the other terminal connected to and kth power supply line VLk. Storage capacitor CST1 stores and maintains a voltage difference between gate electrode of driving transistor QD1 and kth power supply line VLk.

Light emitting element EL1 has a first electrode connected to driving transistor QD1 and a second electrode connected to a common voltage Vss.

Second pixel P2 is bounded by nth gate bus line GLn, a (k+1)th power supply line VL(k+1), and mth data bus line DLm which is shared with first pixel P1. Second pixel P2 includes a first switching transistor QS21, a second switching transistor QS22, a driving transistor QD2 and a light emitting element EL2. The structure of second pixel P2 is substantially similar to that of first pixel P1 except that the gate electrode of second switching transistor QS22 is connected to nth gate bus line GLn.

First switching transistor QS21 includes a source electrode connected to mth data bus line DLm, a drain electrode connected to second switching transistor QS22, and a gate electrode connected to nth gate bus line GLn.

Second switching transistor QS22 includes a source electrode connected to the drain of first switching transistor QS21, a drain electrode connected to the gate of driving transistor QD2, and a gate electrode connected to nth gate bus line GLn.

Driving transistor QD2 includes a drain electrode connected to (k+1)th power supply line VLk+1, a source electrode connected to light emitting element EL2.

Storage capacitor CST2 is connected between node N2 and gate electrode of driving transistor QD2 and (k+1)th power supply line VLk+1. Storage capacitor CST2 holds and maintains a voltage difference between gate electrode of driving transistor QD2 and (k+1)th power supply.

Light emitting element EL2 has a first electrode connected to source of driving transistor QD2 and a second electrode connected to a common voltage Vss.

Third pixel P3 is bounded by nth gate bus line GLn, a kth power supply line VLk which is shared with first pixel P1, and a (m−1)th data bus line DL(m−1). Third pixel P3 includes a first switching transistor QS31, a second switching transistor QS32, a driving transistor QD3 and a light emitting element EL3. The structure of pixel P3 is same as that of pixel P2.

First switching transistor QS31 includes a source electrode connected to (m−1)th data bus line DL(m−1), a drain electrode connected to second switching transistor QS32, and a gate electrode connected to nth gate bus line GLn.

Second switching transistor QS32 includes a source electrode connected to first switching transistor QS31, a drain electrode connected to the gate of driving transistor QD3, and a gate electrode connected to nth gate bus line GLn.

Driving transistor QD3 includes a drain electrode connected to kth power supply line VLk, a source electrode connected to light emitting element EL3.

Storage capacitor CST3 is connected between node N3 and kth power supply VLk. Storage capacitor CST3 holds and maintains a voltage difference between gate electrode of driving transistor QD3 and kth power supply VLk.

Light emitting element EL3 has a first electrode connected to driving transistor QD3 and a second electrode connected to a common voltage Vss.

First pixel P1, second pixel P2 and third pixel P3 operate in the same manner. The operation is explained with an example of first pixel P1.

An nth gate signal is applied to nth gate bus line GLn and first switching transistor QS11 turns on. At the same time, a (n+1)th gate signal is applied to (n+1)th gate bus line GL(n+1) and second switching transistor QS12 turns on. When first and second switching transistor QS11 and QS12 turn on, a data signal from data bus line DLm is provided to the gate electrode of driving transistor QD1. When the data signal is applied to gate electrode of driving transistor QD1, driving transistor QD1 turns on and controls the amount of current flowing through the driving transistor QD1 from power supply line VLk. Light emitting element EL1 emits light having intensity depending on an output current flowing through driving transistor QD1. The magnitude of the output current of driving transistor QD1 is a function of the voltage difference between gate electrode of driving transistor QD1 and source electrode of driving transistor QD1. Storage capacitor CST1 stores and maintains the data signal between gate electrode of driving transistor QD1 and drain electrode of driving transistor QD1.

Figure 2:
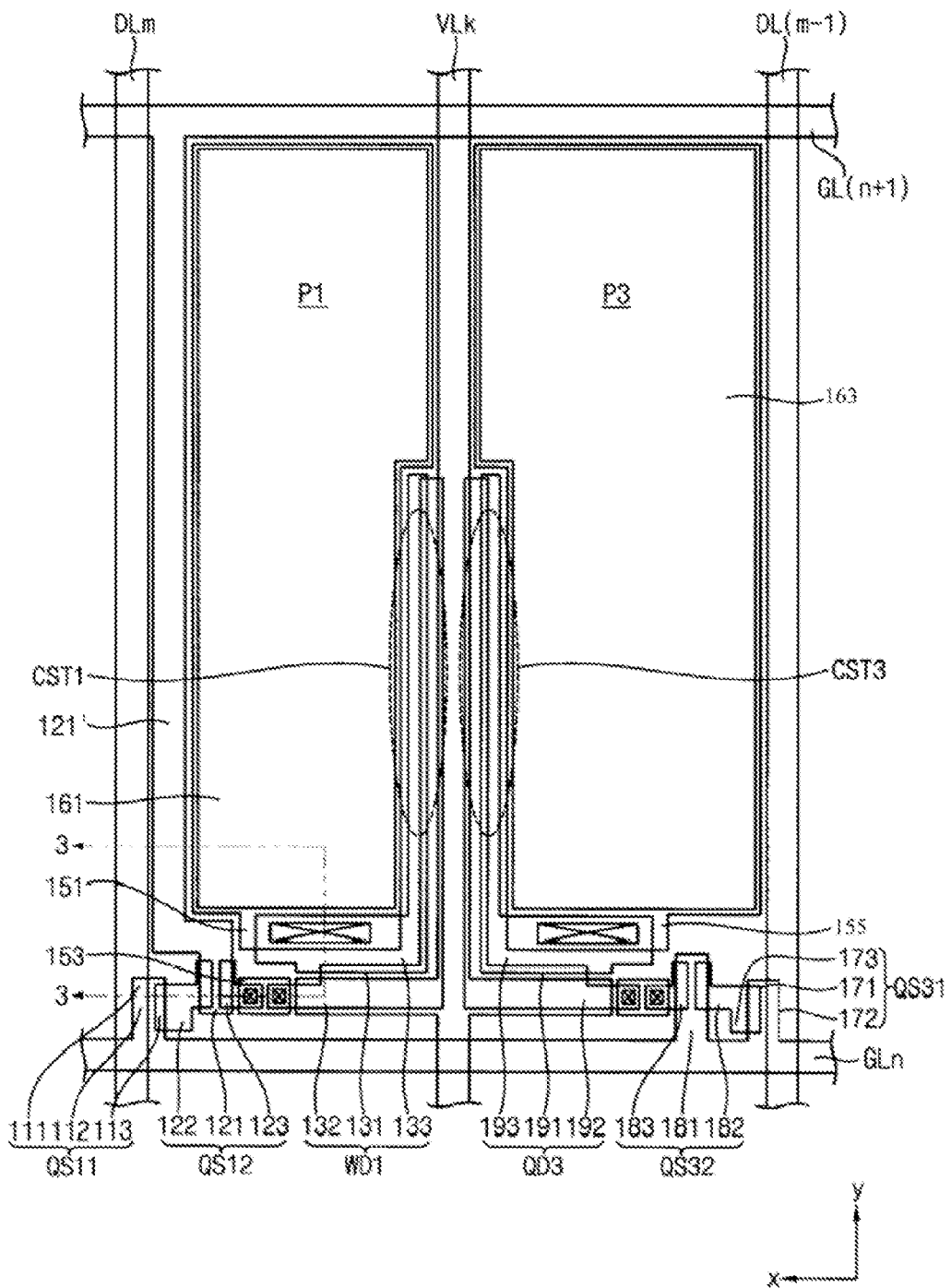
FIG. 2 is a plan view of the physical layout of the OLED of FIG. 1.

FIG. 2 is a plan view showing the structure and layout of first pixel P1 and third pixel P3 of FIG. 1.

According to FIG. 2, nth gate bus line GLn and (n+1)th gate bus line GLn+1 extend in a x direction and are arranged in parallel to and spaced apart from each other along a y direction. A mth data bus line DLm, and (m−1)th data bus line each extend in a y direction and are arranged in parallel to and spaced apart from each other along a y direction. A kth power supply line VLk extends in the y direction and is positioned between nth data bus line DLm and (m−1)th data bus line DL(m−1). First pixel P1 shares kth power supply line VLk with adjacent third pixel P3. A distance of 80 μm to 100 μm is provided between kth power supply line VLk and adjacent mth data bus line DLm and/or (m−1)th data bus line DL(m−1). A distance of about 160 μm to 200 μm may be provided between from mth data bus line DLm and to (m−1)th data bus line DLm−1. This distance prevents a short circuit between the power supply line and adjacent data bus lines during fabricating the display device.

First pixel P1 includes a first switching transistor QS11, a second switching transistor QS12, a driving transistor QD1, a storage capacitor CST1, a first electrode 151 and organic light emitting layer 161 are formed on first electrode 151. First pixel P1 further includes a second electrode (not shown) formed on organic light emitting layer 161.

First switching transistor QS11 has a source electrode 112 connected to mth data bus line DLm, a drain electrode 113 connected to second switching transistor QS12, and a gate electrode 111 protruded from nth gate bus line GLn.

Second switching transistor QS12 has a source electrode 122 connected to drain electrode 113 of first switching transistor QS11, a drain electrode 123 connected to driving transistor QD1, and a gate electrode 121 connected to (n+1)th gate bus line GLn+1 through a extended wire 121'.

Driving transistor QD1 has a drain electrode 132 connected to kth power supply line VLk, a source electrode 133 connected to first electrode 151 of light emitting element EL1, and a gate electrode 131 connected to second switching transistor QS12.

Storage capacitor CST1 is connected to drain electrode 123 of second switching transistor QS12, gate electrode 131 of driving transistor QD1 and kth power supply line VLk. Storage capacitor CST1 stores and maintains a voltage between gate electrode of driving transistor QD1 and kth power supply line VLk.

Third pixel P3 includes a first switching transistor QS31, a second switching transistor QS32, a driving transistor QD3, a storage capacitor CST3, a first electrode 155 and organic light emitting layer 163 formed on first electrode 155. First pixel P3 further includes a second electrode (not shown) formed on organic light emitting layer 163.

First switching transistor QS31 has a source electrode 172 connected to (m−1)th data bus line DL(m−1), a drain electrode 173 connected to second switching transistor QS32, and a gate electrode 171 connected to nth gate bus line GLn.

Second switching transistor QS32 has a source electrode 182 connected to drain electrode 173 of first switching transistor QS31, a drain electrode 183 connected to driving transistor QD3, and a gate electrode 181 connected to nth gate bus line GLn.

Driving transistor QD3 has a drain electrode 192 connected to kth power supply line VLk, a source electrode 193 connected to first electrode 155 of light emitting element, and a gate electrode 191 connected to second switching transistor QS12.

Storage capacitor CST3 is connected to drain electrode 183 of second switching transistor QS32, gate electrode 191 of driving transistor QD3 and kth power supply line VLk. Storage capacitor CST3 stores and maintains a voltage between gate electrode 191 of driving transistor QD3 and kth power supply line VLk.

Figure 3:
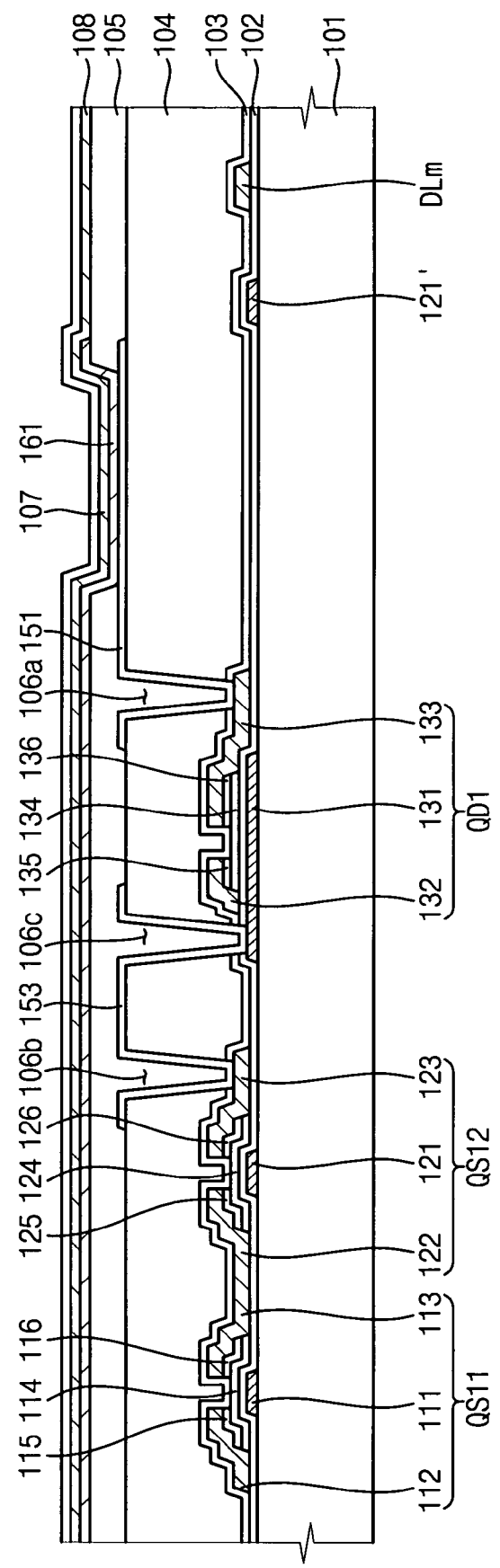
FIG. 3 is a cross-sectional view taken along the line 3-3 of the OLED of FIG. 2.

FIG. 3 is a cross sectional view taken along the line 3-3 of an OLED of FIG. 2. Referring to FIG. 3, a gate metal pattern is formed on a substrate 101. The gate metal pattern includes gate electrode 111 of first switching transistor QS11, gate electrode 121 of second switching transistor QS12, gate electrode 131 of driving transistor QD1, and extended wire 121' connecting gate electrode 121 of switching transistor QS12 to (n+1)th gate bus line GL(n+1).

A gate insulating layer 102 is formed on the gate metal pattern. A first channel 114 of first switching transistor QS11, a second channel 124 of second switching transistor QS12 and a third channel 134 of driving transistor QD1 are formed on the gate insulating layer 102.

A data metal layer is formed over first, second and third channels 114, 124, 134 respectively, and gate insulating layer 102. The data metal layer is patterned to provide source electrodes 112, 122, 133 and drain electrodes 113, 123, 132 of transistors QS11, QS12, QD1. Ohmic contact layers 115, 116, 125, 126, 135, 136, are disposed between source/drain electrodes 112, 113, 122, 123, 132, 133 and channels 114, 124, 134 to reduce resistances.

A first insulating layer 103 is formed on the data metal pattern. First insulating layer 103 can be formed of nitride to protect under-layers. A second insulation layer 104 is formed on the first insulating layer 103. Second insulating layer 104 can be formed of a low dielectric insulating material, such as poly imide, poly amide, acryl layer, and benzocyclobutadien (BCB). Second insulating layer 104 may be made of a material having a flatness characteristic or photosensitivity. First and second insulating layers 103, 104 include a first contact hole 106a to expose source electrode 133 of driving transistor QD1, a second contact hole 106b to expose drain electrode 123 of second switching transistor QS12, a third contact hole 106c to expose gate electrode 131 of driving transistor QD1.

A first electrode 151 and a connecting electrode 153 are formed on second insulating layer 104. First electrode 151 is electrically connected to driving transistor QD1 through first contact hole 106a. Connecting electrode 153 connects gate electrode 131 of driving transistor QD1 to drain electrode 123 of second switching transistor QS12 through second contact hole 106b and third contact hole 106c. First electrode 151 and connecting electrode 153 can be formed of transparent conductor such as indium tin oxide (ITO) and indium zinc oxide (IZO).

A layer of insulating material 105 is formed on second insulating layer 104, first electrode 151, and connecting electrode 153. Layer 105 includes a through-hole that exposes a portion of first electrode 151.

An organic light emitting layer 161 is formed in the hole of layer 105. Organic light emitting layer 161 may include a light emitting layer which emits red, green, or blue light. Generally, organic light emitting layer 161 has a plurality of sub-layers, e.g., a hole-injection layer, an electron-injection layer, and a light-emitting layer. The composition of the foregoing layers and the construction thereof are well-known to those skilled in the art. Accordingly, no further description is required.

A second electrode 107, which covers the whole area of first substrate 101 except where terminals for connecting to external circuits are formed, is formed over layer 105 and organic light emitting layer 161. First electrode 151 and second electrode 107 can be formed in various embodiments. In one embodiment, first electrode 151 is made of a transparent conductive material, such as ITO, IZO and second electrode 107 is made of an opaque metal, such as calcium (Ca), barium (Ba), silver (Ag), copper (Cu), aluminum (Al), magnesium (Mg) or alloys thereof. On the contrary, first electrode 151 may be formed of an opaque metal and second electrode 107 may be formed of a transparent conductive material.

A protective layer 108 is formed on the second electrode 107 to prevent moisture or oxygen from entering the OLED.

Figure 4:
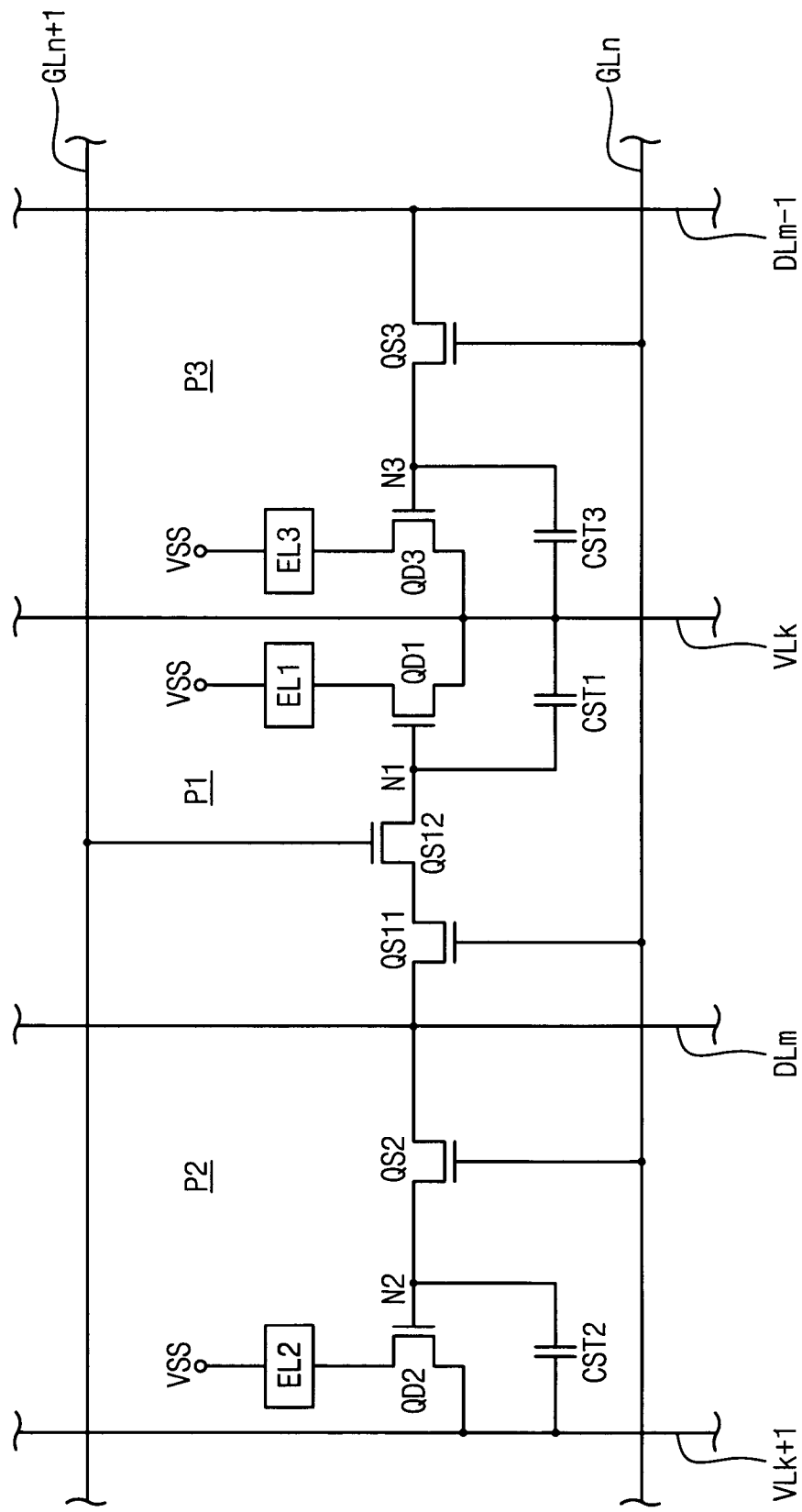
FIG. 4 is an equivalent circuit diagram of pixels of a display panel for an OLED according to another embodiment of the present invention.

In another example, OLED may include a color filter (not shown) between first insulating layer 103 and second insulating layer 104. FIG. 4 is an equivalent circuit of pixels of an OLED according to another embodiment of the present invention. The circuit shown in FIG. 4 are substantially identical to the circuit elements shown in the embodiment described above with respect to FIG. 2 except that a second pixel P2 and a third pixel P3 includes a switching transistor QS2, QS3 respectively instead of having two switching transistors. Thus, like numerals refer to like circuit elements as described above with respect to FIG. 2 and further explanation of the like elements will be omitted.

Second pixel P2 includes a switching transistor QS 2 connected to a nth gate bus line GLn, a mth data bus line DLm and a gate electrode of driving transistor QD2.

Third pixel P3 includes a switching transistor QS3 connected to nth gate bus line GLn, a (m−1)th data bus line DL(m−1) and a gate electrode of driving transistor QD3.

Although the transistors shown in embodiments of the present invention have been described with reference to n type transistors, p type transistors may be used.

Figure 5A:
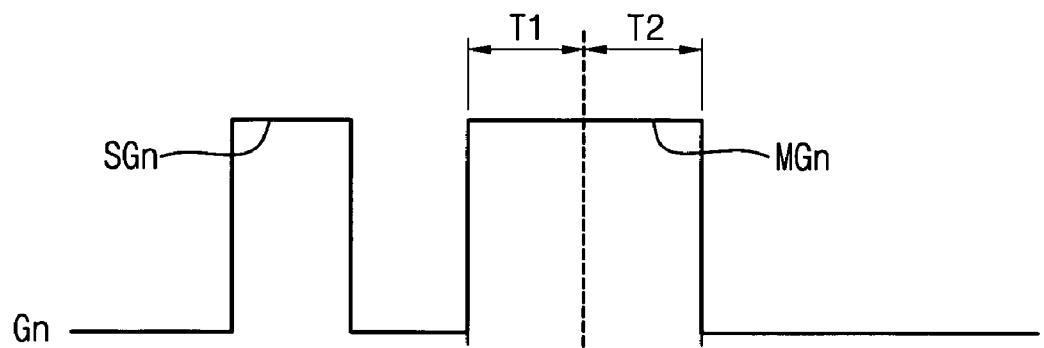
FIGS. 5A and 5B are exemplary waveforms of gate signals for driving an OLED according to an embodiment of the present invention.
Figure 5B:
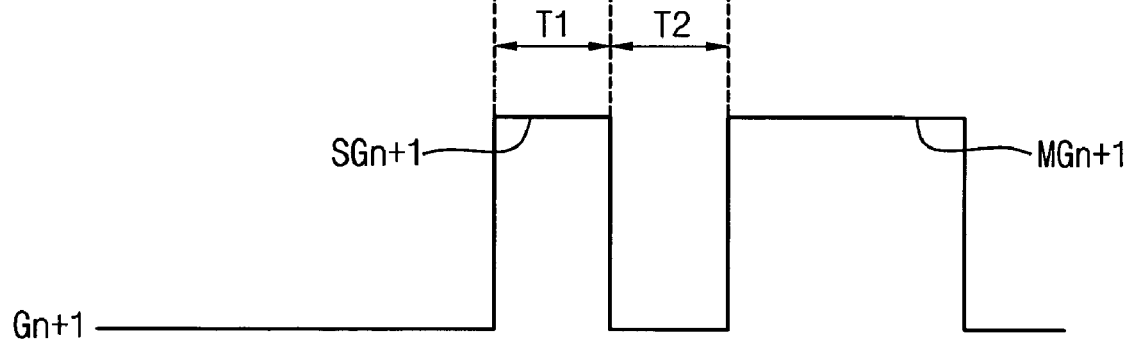

FIGS. 5A and 5B gate signal illustrate waveforms of the gate signals transmitted to a gate bus line of an OLED according to an embodiment of the present invention.

As illustrated in FIG. 5A, a gate signal includes a sub-pulse SG and a main pulse MG. The SG has the same timing period as a main pulse MG applied to a previous gate bus line, desirably the same timing period as a first period of main pulse. Dashed lines between FIGS. 5A and 5B are used to show the timing relationship between the two waveforms.

Referring to FIG. 1 and FIGS. 5A and 5B, an nth gate signal Gn is applied to nth gate bus line GLn. A sub-pulse SG(n+1) of a (n+1)th gate signal G(n+1) is applied to (n+1)th gate bus line GL(n+1) during a first time period T1 of a main pulse MGn of nth gate signal Gn as shown in FIG. 5A.

During the first period T1, first switching transistor QS11 is connected to nth gate bus line GLn and second switching transistor QS12 connected to (n+1)th gate bus line GL(n+1) turn on, and a data signal transmits from mth data bus line DLm to gate electrode of driving transistor QD1. The driving current flows through driving transistor QD1 so that light emitting element EL1 emits light when driving transistor QD1 turns on. Also, during first period T1, first and second switching transistors QS21, QS22 of second pixel P2, which are connected to nth gate bus line GLn, turn on and light emitting element EL2 of second pixel P2 emits light. QS22 of second pixel P2, which are connected to nth gate bus line GLn, turn on and light emitting element EL2 of second pixel P2 emits light.

During a second period T2 of main pulse MGn of nth gate signal Gn, (n+1)th gate signal Gn+1 is low so that second switching transistor QS12 connected to (n+1)th gate bus line GL(n+1) turns off and second switching transistor QS22 connected to nth gate bus line GLn turns on. Accordingly, light emitting element EL 1 of first pixel P1 doesn't emit light, but light emitting element EL2 of second pixel P2 emits light. First pixel P1 and second pixel P2, which share mth data bus line DLm, can operate independently in the manner as described above.

Figure 6A:
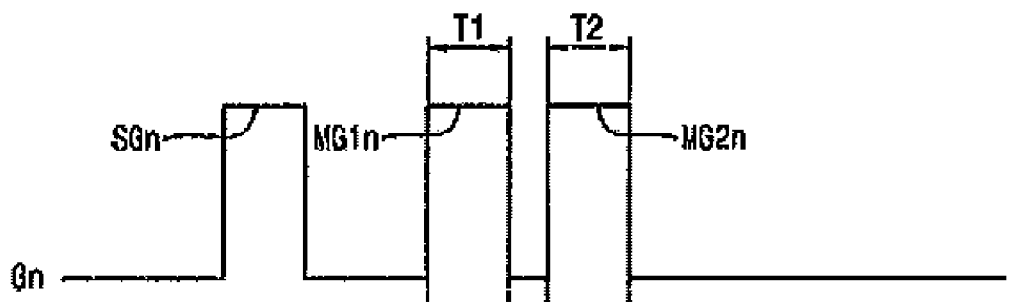
FIGS. 6A and 6B are exemplary waveforms of gate signals for driving an OLED according to another embodiment of the present invention.
Figure 6B:
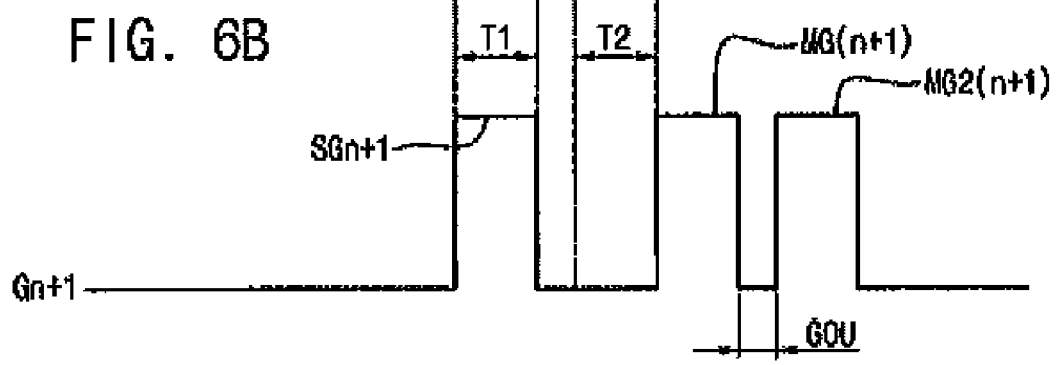

FIGS. 6A and 6B illustrate waveforms of the gate signal transmitted to a gate bus line of an OLED according to another embodiment of the present invention.

Referring to FIGS. 1, 2 and FIG. 6, a gate signal includes a sub-pulse SG, a first main pulse MG1 and a second main pulse MG2. The sub-pulse SG has the same timing period as first main pulse MG1 applied to a previous gate bus line. There is low period GOU having a constant width between first main pulse MG1 and second main pulse MG2.

A nth gate signal Gn is applied to nth gate bus line GLn. A sub-pulse SG(n+1) of a (n+1)th gate signal G(n+1) is applied to (n+1)th gate bus line GL(n+1) while a first period T1 of first main pulse MG1 is applied to nth gate bus line GLn.

During the first period T1, first switching transistor QS11 connected to nth gate bus line GLn and second switching transistor QS12 connected to (n+1)th gate bus line GL(n+1) turn on, and a data signal transmits from mth data bus line DLm to gate electrode of driving transistor QD1. Driving transistor QD1 turns on, and the driving current flows through driving transistor QD1 so that light emitting element EL1 emits light. Also, during first period T1, first and second switching transistor QS21, QS22 of second pixel P2, which are connected to nth gate bus line GLn, turn on and a data signal transmits from mth data bus line DLm to gate electrode of driving transistor QD2. Driving transistor QD2 turns on, and the driving current flows through driving transistor QD2 so that light emitting element EL2 of second pixel P2 emits light.

During a second period T2, second main pulse MG2 of nth gate signal Gn is applied to nth gate bus line GLn, and (n+1)th gate signal G(n+1) is low so that second switching transistor QS12 connected to (n+1)th gate bus line GL(n+1) turns off and second switching transistor QS22 connected to nth gate bus line GLn turns on. It causes light emitting element EL1 of first pixel P1 not to emit light and light emitting element EL2 of second pixel P2 to emit light.

Accordingly, first pixel P1 operates during first period T1 and second pixel P2 sharing data bus line DLm with first pixel P1 operates during second period T2.

Figure 7:
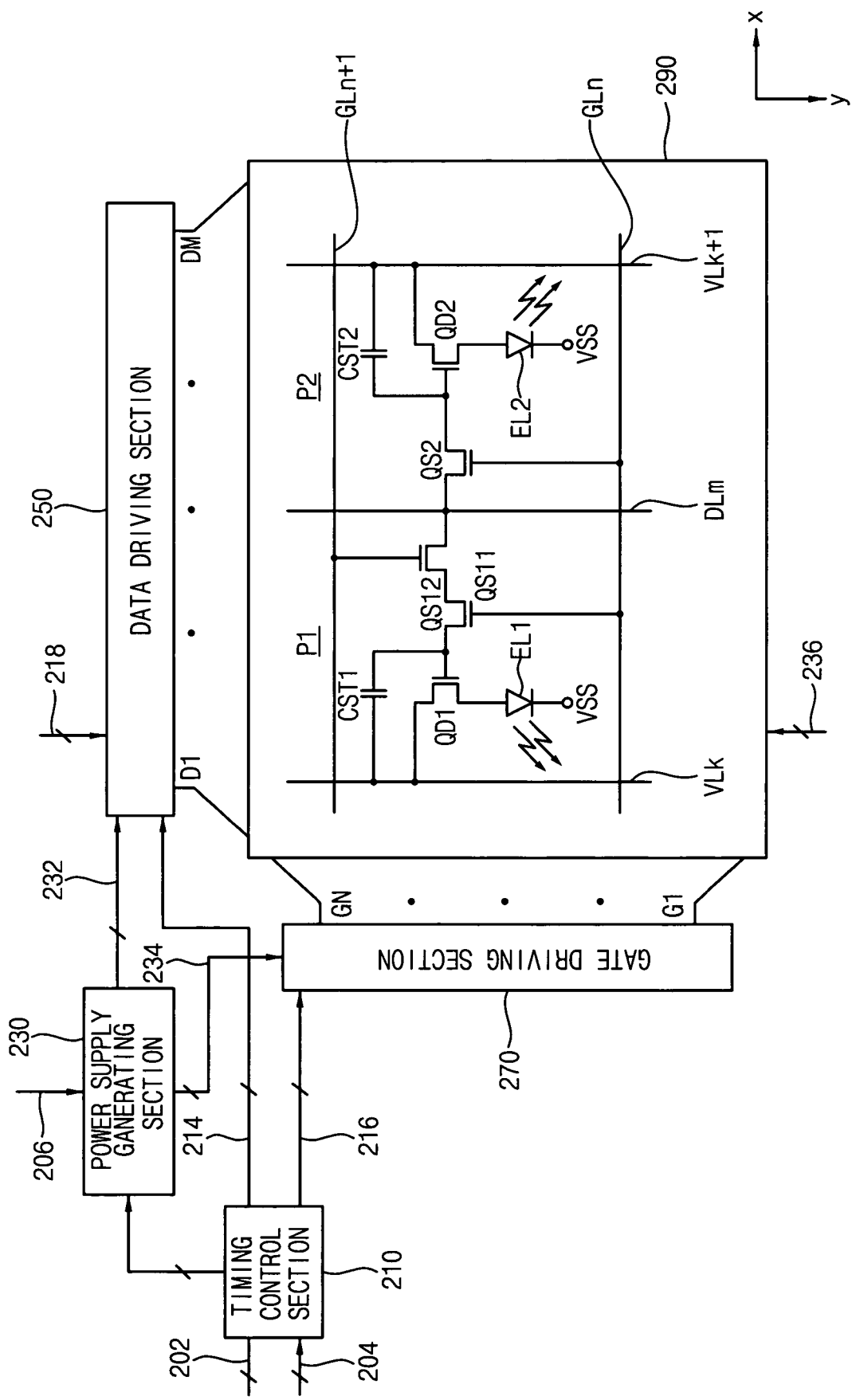
FIG. 7 is a block diagram of an OLED according to an embodiment of the present invention.
Figure 8A:
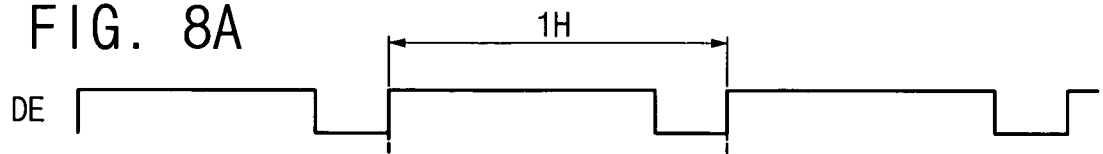
FIGS. 8A-8D are timing diagrams illustrating several signals for operating an OLED of FIG. 7 according to an embodiment of the present invention.
Figure 8B:
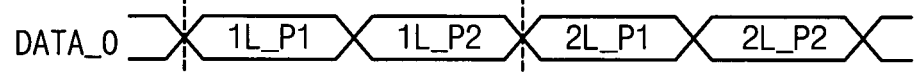
Figure 8C:
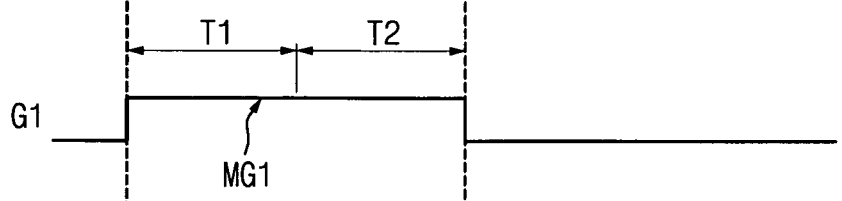
Figure 8D:
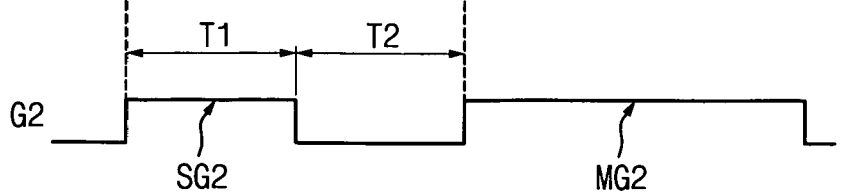
Figure 9A:
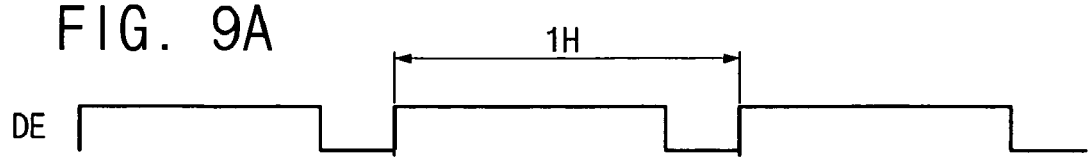
FIGS. 9A-9E are timing diagrams illustrating several signals for operating an OLED of FIG. 7 according to another embodiment of the present invention. Use of the same reference symbols in different figures indicates similar or identical items.
Figure 9B:
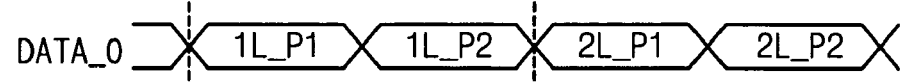
Figure 9C:
Figure 9D:
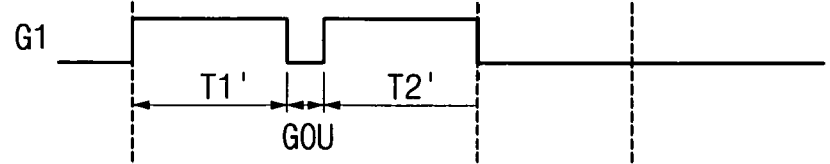
Figure 9E:

FIG. 7 is a block diagram of an OLED according to an embodiment of the present invention.

Referring to FIG. 7, OLED includes a timing control section 210, a power supply generating section 230, a data driving section 250, a gate driving section 270 and an OLED panel 290.

An original control signal over line 202 and an original data signal over line 204 are provided by an external graphic controller (not shown) to timing control section 210. Timing control section 210 outputs a first, a second and a third controlling signals over lines 212, 214, and 216 based on original control signal received over line 202 and original data signal received over line 204.

First control signal provided over line 212 inputs to power supply generating section 230 and controls the operation of power supply generating section 230. Second control signal provided over line 214 inputs to data driving section 250 and controls the operation of data driving section 250. The third control signal provided over line 216 is provided to gate driving section 270 and controls the operation of gate driving section 270.

Timing control section 210 processes the original data signal received over line 204 and outputs a first data signal over line 218 to data driving section 250.

Power supply generating section 230 receives an external power voltage over line 206 to generates a first, a second, and a third operation voltages provided over lines 232, 234, 236. First operation voltage provided over line 232 includes a reference gamma voltage (Vref) provided over line 232 to operate data driving section 250. The second operation voltage provided over line 234 has a Von of gate signal to turn on a transistor and a Voff of gate signal to turn off a transistor. The third operation voltage provided over line 236 has a driving voltage Vdd and a common voltage Vss to operate OLED panel 290.

Data driving section 250 converts first data signal received over line 218 from timing control section 210 into analog second data signals D1 . . . Dm based on reference gamma voltage and outputs the second data signals D1 . . . Dm to data bus lines. The number of output terminals of data driving section 250 corresponds to the number of data bus lines.

A pixel of OLED shares a data bus line with adjacent pixel. Thus, data driving section 250 twice outputs second data signals D1 . . . Dm to each data bus line during 1H period, which means the period for operating a gate bus line. For instance, data driving section 250 outputs second data signals D1, D3 . . . Dm−1 for odd data bus lines during an initial period of 1H and second data signals D2, D4 Dm for even data bus lines during a rest period of 1H.

Gate driving section 270 generates gate signals G1, . . . , Gn based on the third control signal received over line 216 from timing control section 210. Gate signals G1, . . . , Gn have waveforms shown in FIGS. 5A, 5B, 6A and 6B to operate the pixel of OLED of the present invention.

OLED panel 290 includes new pixel structure according to an embodiment of the present invention. A first pixel P1 shares a data bus line DLm with adjacent second pixel P2. Also, OLED panel 290 includes a third pixel P3 (not shown) sharing a power supply line VLk with first pixel P1.

Circuit elements and structures of first pixel P1 and second pixel P2 are identical to elements and structures shown in FIG. 4. Accordingly, further explanation is not required.

FIGS. 8A-8D are timing diagrams of signals for operating an OLED of FIG. 7 according to an embodiment of the present invention.

Referring to FIG. 7 and FIGS. 8A-8D, timing control section 210 outputs first data signal over line 218 into data driving section 250 based on data enable signal DE. Data driving section 250 outputs second data signals DATA_0 into data bus lines. Data driving section 250 outputs second data signal 1L_P1 for first pixel P1 into data bus line DLm during a first half period of 1H, and second data signal 1L_P2 for second pixel P2 into data bus line DLm during rest period of 1H.

The waveforms of a first and second gate signal G1 and G2 are same as those shown in FIGS. 5A and 5B.

As data driving section 250 outputs second data signal 1L_P1 for first pixel P1 to data bus line DLm, a first gate signal G1 is applied to a first gate bus line. During a first period T1 of first gate signal G1, a second gate signal G2 is applied to a second gate bus line at the same time. Switching transistors QS11, QS12 of first pixel P1 and switching transistor QS2 of second pixel P2 turn on and second data signal 1L_P1 transmits from data bus line DLm to gate electrode of driving transistor QD1 and gate electrode of driving transistor QD2. Light emitting elements EL1 and EL2 emits light corresponding to second data signal 1L_P1. That is, both of first pixel P1 and second pixel P2 operate during the first period T1.

When data driving section 250 outputs second data signal 1L_P2 for second pixel P2 to data bus line DLm during a second period T2 of first gate signal G1, first gate signal G1 is high but second gate signal G2 is low. Switching transistor QS11 of first pixel P1 turns off, but switching transistor QS2 turns on. Accordingly, first pixel P1 doesn't operates and light emitting element EL1 doesn't emit light corresponding to second data signal 1L_P2. However, second pixel P2 operates and light emitting element EL2 emits light corresponding to second data signal 1L_P2.

FIGS. 9A-9E are timing diagrams illustrating several signals for operating an OLED of FIG. 7 according to another embodiment of the present invention.

Referring to FIG. 7 and FIGS. 9A-9E, timing control section 210 outputs first data signal over line 218 into data driving section 250 based on data enable signal DE. Data driving section 250 outputs second data signals DATA_0 into data bus lines. Data driving section 250 outputs second data signal 1L_P1 for first pixel P1 into data bus line DLm during a first half period of 1H, and second data signal 1L_P2 for second pixel P2 into data bus line DLm during rest period of 1H.

The waveforms of a first and second gate signal G1 and G2 are same as the shown in FIG. 6. There is low period GOU between main pulses of a gate signal. The low period GOU is generated by a gate output enable signal OE, which timing control section 210 provides to gate driving section 270. That is, high gate output enable signal OE causes low period GOU between main pulses. When data driving section 250 outputs second data signal 1L_P1 for first pixel P1 to data bus line DLm, a first gate signal G1 is applied to a first gate bus line. During a first period T1' of first gate signal G1, a second gate signal G2 is applied to a second gate bus line at the same time. Switching transistors QS11, QS12 of first pixel P1 and switching transistor QS2 of second pixel P2 turn on and second data signal 1L_P1 transmits from data bus line DLm to gate electrode of driving transistor QD1 and gate electrode of driving transistor QD2. Light emitting elements EL1 and EL2 emits light corresponding to second data signal 1L_P1. That is, both of first pixel P1 and second pixel P2 operates during the first period T1.

When data driving section 250 outputs second data signal 1L_P2 for second pixel P2 to data bus line DLm during a second period T2' of first gate signal G1, first gate signal G1 is high but second gate signal G2 is low. Switching transistor QS11 of first pixel P1 turns off, but switching transistor QS2 turns on. Accordingly, first pixel P1 doesn't operates and light emitting element EL1 doesn't emit light corresponding to second data signal 1L_P2. However, second pixel P2 operates and light emitting element EL2 emits light corresponding to second data signal 1L_P2.

Low period GOU between first period T1' and second period T2' prevents second data signal 1L_P2 for second pixel P2 from transmitting the gate electrode of driving transistor QD1 of first pixel P1.

Accordingly, first pixel P1 and second pixel P2 of OLED panel 290, which share mth data bus line DLm, can display independently images corresponding to data signals outputted from data driving section 250 in the manner as described above.

Although the invention has been described with reference to particular embodiments, the description is an example of the invention's application and should not be taken as a limitation. Various adaptations and combinations of the features of the embodiments disclosed are within the scope of the invention as defined by the following claims.

What is claimed is:

1. A display device comprising:
   a first gate bus line extending in a first direction;
   a second gate bus line adjacent to the first gate bus line and extending in the first direction;
   a first power supply line extending in a second direction;
   a second power supply line adjacent to the first power supply line and extending in the second direction;
   a data bus line extending in the second direction and being positioned between the first and the second power supply line; and
   a first pixel and a second pixel positioned between the first gate bus line, the second gate bus line, the first power supply line and the second power supply line,
   wherein the first pixel and the second pixel share the data bus line,
   wherein the first pixel comprises:
   a first switching transistor electrically connected to the data bus line and the first gate bus line; and
   a first controlling transistor electrically connected to the second gate bus line, and
   wherein the second pixel comprises:
   a second switching transistor electrically connected to the data bus line and the first gate bus line; and
   a second controlling transistor electrically connected to the first gate bus line.

2. The display device of claim 1, wherein the first pixel further comprises:
   a first driving transistor electrically connected to the first switching transistor and the first power supply line; and
   a light emitting element connected to the first driving transistor.

3. The display device of claim 2, wherein the light emitting element emits light when the first gate bus line and the second gate bus line activates at the same time.

4. The display device of claim 3, further comprising a first charge storage device coupled between the first driving transistor and the first power supply line.

5. The display device of claim 4 wherein the second pixel comprises:
   a second driving transistor electrically connected to the second switching transistor; and
   a second light emitting element electrically connected to the driving transistor.

6. The display device of claim 5, wherein the second light emitting element emits light in response to a signal provided on the first gate bus line.

7. The display device of claim 6, further comprising a second storage capacitor connected between the second driving transistor and the second power supply line.

8. The display device of claim 7, wherein the second controlling transistor is coupled between the second switching transistor and the second driving transistor.

9. The display device of claim 8, wherein a distance between the data bus line and adjacent data bus line is about 160 μm to 200 μm.

10. A display device comprising;
    a first gate bus line extending in a first direction;
    a second gate bus line adjacent to the first gate bus line and extending in the first direction;
    a first power supply line extending in a second direction;
    a second power supply line positioned in parallel to the first power supply line;
    a data bus line extending in the second direction and positioned between the first power supply line and the second power supply line;
    a first switching transistor electrically connected to the first gate bus line and the data bus line;
    a first driving transistor electrically connected to the first power supply line;
    a first controlling transistor electrically connected to the second gate bus line, the first switching transistor and the first driving transistor;
    a first light emitting element electrically connected to the first driving transistor;
    a second switching transistor electrically connected to the first gate bus line and the data bus line;
    a second driving transistor electrically connected to the second switching transistor and the second power supply line;
    a second controlling transistor electrically connected to the first gate bus line, the second switching transistor and the second driving transistor; and
    a second light emitting element electrically connected to the second driving transistor.

11. The display device of claim 10, further comprising a first storage capacitor electrically connected between the first driving transistor and the first power supply line.

12. The display device of claim 11, further comprising a second storage capacitor connected between the second driving transistor and the second power supply line.

13. A display device comprising:
    a first pixel and a second pixel adjacent to the first pixel, wherein the first pixel and second pixel are bounded by a first gate bus line) a second gate bus line, a first power supply line and a second power supply line;
    a data bus line positioned between the first and the second power supply line,
    wherein the first pixel comprises:
    a first switching transistor electrically connected to the data bus line and the first gate bus line; and
    a first controlling transistor electrically connected to the second gate bus line, and
    wherein the second pixel comprises:
    a second switching transistor electrically connected to the data bus line and the first gate bus line; and
    a second controlling transistor electrically connected to the first gate bus line.

* * * * *